(12) United States Patent
Lam et al.

(10) Patent No.: US 8,652,901 B1
(45) Date of Patent: Feb. 18, 2014

(54) SINGLE-MASK SPACER TECHNIQUE FOR SEMICONDUCTOR DEVICE FEATURES

(71) Applicant: International Business Machines Corporation, Armonk, NY (US)

(72) Inventors: Chung H. Lam, Peekskill, NY (US); Jing Li, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/783,388

(22) Filed: Mar. 3, 2013

(51) Int. Cl.
*H01L 21/336* (2006.01)

(52) U.S. Cl.
USPC ..... 438/259; 438/242; 438/270; 257/E21.655

(58) Field of Classification Search
USPC ......... 438/206, 209, 212, 242, 259, 262, 270; 257/E21.655
See application file for complete search history.

(56) References Cited

U.S. PATENT DOCUMENTS

| 6,156,611 A | 12/2000 | Lan et al. ...................... 438/268 |
| 2010/0181641 A1* | 7/2010 | Blank ........................... 257/520 |

* cited by examiner

*Primary Examiner* — Thanhha Pham
(74) *Attorney, Agent, or Firm* — Ido Tuchman; Louis J. Percello

(57) ABSTRACT

A method for fabricating vertical surround gate structures in semiconductor device arrays. The method includes forming pillars separated by vertical and horizontal trenches on a substrate. Forming a gate layer over the pillars and trenches such that the gate layer forms gate trenches in the horizontal trenches. The method includes forming fillers within the gate trenches, and planarizing the gate layer and fillers. The method also includes successively etching a first portion of the gate layer, removing the fillers, and etching a second portion of the gate layer.

14 Claims, 10 Drawing Sheets

SINGLE-MASK SPACER TECHNIQUE FOR SEMICONDUCTOR DEVICE FEATURES

BACKGROUND

This invention relates to the fabrication of semiconductor devices. More particularly, the present invention relates to a method for fabricating vertical surround gate structures in a semiconductor device array.

In semiconductor device applications, conventional planar transistors have the most mature integration process. However, in memory applications, particularly access devices (or selectors), reduction of device footprint is essential to improve memory density. Planar transistor performance is generally restricted by channel width and length. Reducing channel width or length can improve memory density at the cost of degraded device performance.

Thus vertical surround gate devices have become more attractive for such memory applications. In vertical surround gate devices the current flow is oriented in a vertical direction, providing many advantages to area efficiency. However, current reliable integration processes of vertical surround gate devices are relatively complex and expensive. In addition, in many applications, it is desirable to make the processes compatible with standard planar CMOS processes.

BRIEF SUMMARY

An aspect of the invention is a method for fabricating vertical surround gate structures in a semiconductor device array. The method includes forming a plurality of pillars on a substrate such that the pillars are separated by vertical and horizontal trenches. The method also includes forming a gate layer over the pillars and trenches such that the gate layer forms gate trenches in the horizontal trenches. The method includes forming fillers within the gate trenches, and planarizing the gate layer and fillers. The method also includes successively etching a first portion of the gate layer, removing the fillers, and etching a second portion of the gate layer.

Another aspect of the invention is a method for fabricating vertical surround gate structures in a semiconductor device array. The method includes forming a plurality of pillars on a substrate such that the pillars are separated by vertical and horizontal trenches. The method also includes forming a dielectric layer over the pillars and trenches. The method includes forming a metal gate layer over the dielectric layer. The method also includes forming a gate layer over the metal gate layer such that the gate layer forms gate trenches in the horizontal trenches. The method includes forming fillers within the gate trenches, and planarizing the gate layer and fillers. The method also includes successively etching a first portion of the gate layer, removing the fillers, and etching a second portion of the gate layer.

DETAILED DESCRIPTION

The present invention is described with reference to various embodiments of the invention. Throughout the description of the invention, reference is made to FIG. 1 through FIG. 10.

Additionally, relative terms, such as "horizontal", "vertical", "top", "over", and "down" are employed with respects to other elements in the described embodiments and figures. Such terms are meant only to describe the referenced embodiments. Therefore, the present invention encompasses alternative orientations of the suggested embodiments.

Embodiments of the present invention provide possible methods of fabricating semiconductor device features. An aspect of the present invention provides a method of fabricating a semiconductor device array with vertical surround gate structures.

Figure 1:
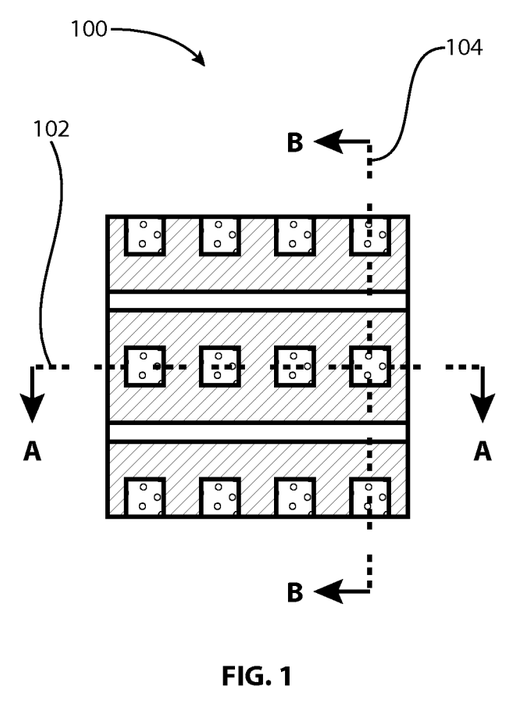
FIG. 1 is a top-down diagram of a semiconductor device array after gate formation, in accordance to one embodiment of the present invention.

FIG. 1 depicts a top-down view of a semiconductor device array 100 after gate formation, in accordance to one embodiment of the present invention. The diagram includes cross-section A 102 and cross-section B 104.

The diagrams from FIG. 2A through 5D are cross-sectional views of intermediary steps during fabrication of a semiconductor device array 100 structure, in accordance to one embodiment of the present invention.

Figure 2A:
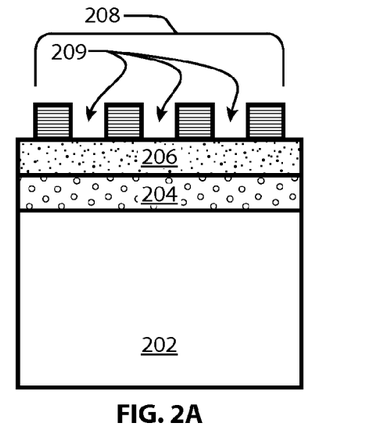
FIG. 2A is a cross-sectional diagram of an intermediary step depicting a first layer, hard mask layer, and a vertical mask pattern formed over a substrate, in accordance to one embodiment of the present invention.
Figure 2B:
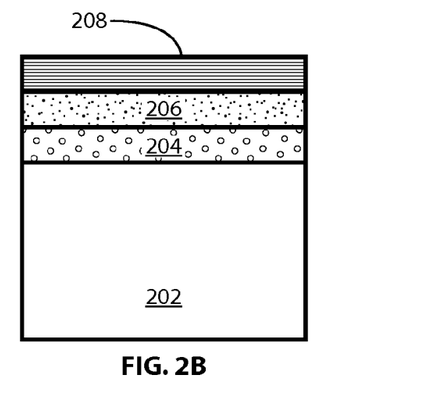
FIG. 2B is a cross-sectional diagram of an intermediary step depicting a first layer, hard mask layer, and a vertical mask pattern formed over a substrate, in accordance to one embodiment of the present invention.

FIG. 2A schematically depicts semiconductor device array 100 from cross-section A 102, after successively forming a first layer 204, hard mask layer 206, and a vertical mask pattern 208 over a substrate 202. The diagram also depicts a plurality of vertical mask trenches 209. In some embodiments, the first layer can be composed of a silicon-nitride (SiN) material. FIG. 2B depicts the same step in fabrication as FIG. 2A, from cross-section B 104.

Figure 2C:
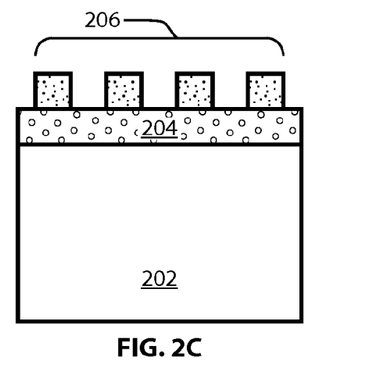
FIG. 2C is a cross-sectional diagram of an intermediary step depicting etched portions of a hard mask layer, in accordance to one embodiment of the present invention.
Figure 2D:
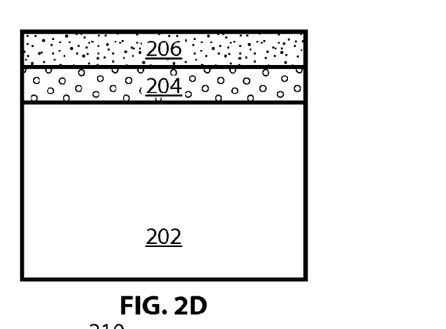
FIG. 2D is a cross-sectional diagram of an intermediary step depicting etched portions of a hard mask layer, in accordance to one embodiment of the present invention.

FIG. 2C schematically depicts semiconductor device array 100 from cross-section A 102, after etching exposed portions of the hard mask layer 206 and removing the vertical mask pattern 208. FIG. 2D depicts the same step in fabrication as FIG. 2C, from cross-section B 104.

Figure 2E:
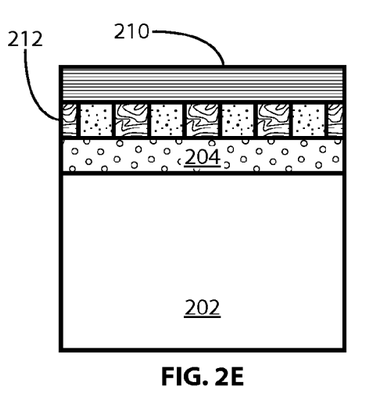
FIG. 2E is a cross-sectional diagram of an intermediary step depicting a horizontal masking pattern formed over the hard mask layer and mask spacer, in accordance to one embodiment of the present invention.
Figure 2F:
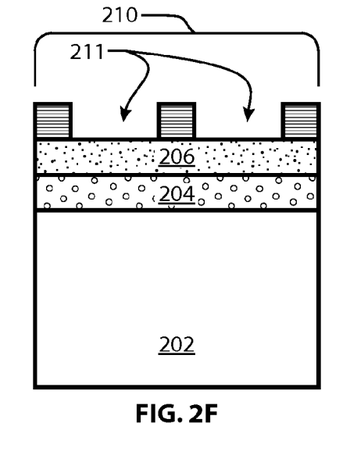
FIG. 2F is a cross-sectional diagram of an intermediary step depicting a horizontal masking pattern formed over the hard mask layer, in accordance to one embodiment of the present invention.

FIG. 2E schematically depicts semiconductor device array 100 from cross-section A 102, after forming a horizontal masking pattern 210 over the hard mask layer 206 and a mask spacer 212. One skilled in the art would recognize that the mask spacer 212 can be composed of any number of materials. FIG. 2F depicts the same step in fabrication as FIG. 2E, from cross-section B 104. FIG. 2F depicts a plurality horizontal mask trenches 211 in the horizontal mask pattern 210.

Figure 3A:
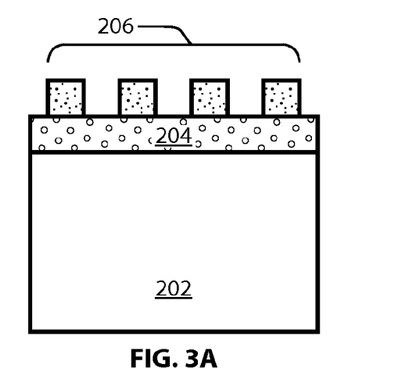
FIG. 3A is a cross-sectional diagram of an intermediary step depicting etched portions of the hard mask layer, in accordance to one embodiment of the present invention.
Figure 3B:
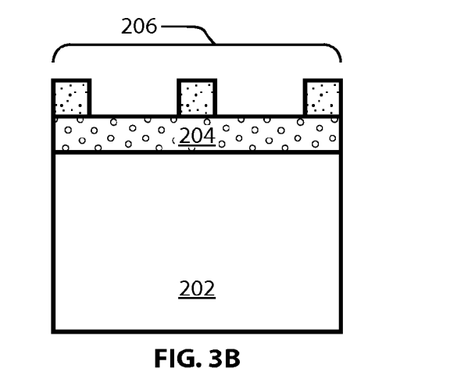
FIG. 3B is a cross-sectional diagram of an intermediary step depicting etched portions of the hard mask layer, in accordance to one embodiment of the present invention.

FIG. 3A schematically depicts semiconductor device array 100 from cross-section A 102, after etching exposed portions of the hard mask layer 206 and removing the horizontal mask pattern 210. FIG. 3B depicts the same step in fabrication as FIG. 3A, from cross-section B 104.

Figure 3C:
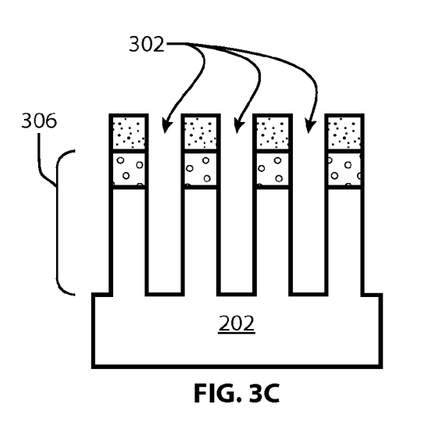
FIG. 3C is a cross-sectional diagram of an intermediary step depicting vertical trenches etched into a first layer and substrate, in accordance to one embodiment of the present invention.
Figure 3D:
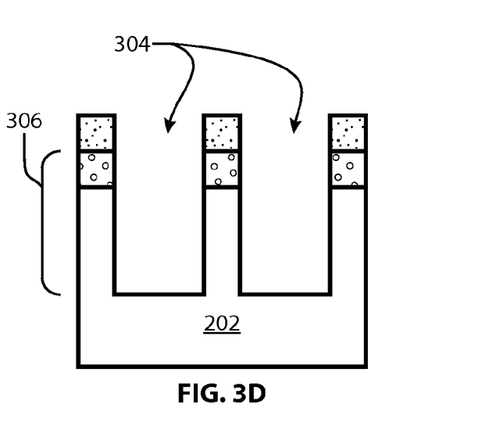
FIG. 3D is a cross-sectional diagram of an intermediary step depicting horizontal trenches etched into a first layer and substrate, in accordance to one embodiment of the present invention.

FIG. 3C schematically depicts semiconductor device array 100 from cross-section A 102, after etching portions of the first layer 204, and the substrate 202. The diagram also depicts a plurality of vertical trenches 302. FIG. 3D depicts the same step in fabrication as FIG. 3C, from cross-section B 104. FIG. 3D also depicts a plurality of horizontal trenches 304.

Figure 3E:
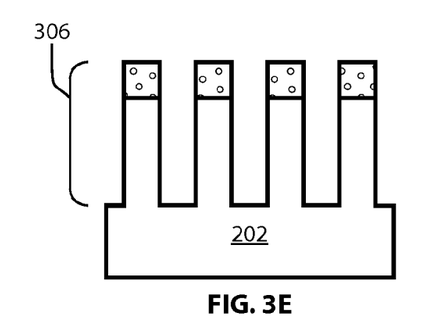
FIG. 3E is a cross-sectional diagram of an intermediary step depicting a plurality of pillars formed over a substrate, in accordance to one embodiment of the present invention.
Figure 3F:
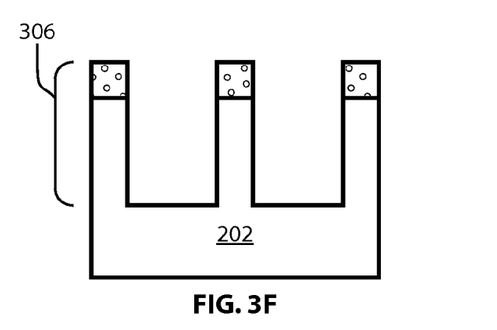
FIG. 3F is a cross-sectional diagram of an intermediary step depicting a plurality of pillars formed over a substrate, in accordance to one embodiment of the present invention.

FIG. 3E schematically depicts semiconductor device array 100 from cross-section A 102, after removing the hard mask layer 206. The diagram depicts a plurality of pillars 306. FIG. 3F depicts the same step in fabrication as FIG. 3C, from cross-section B 104.

Figure 4A:
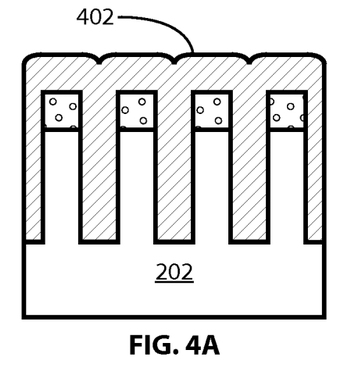
FIG. 4A is a cross-sectional diagram of an intermediary step depicting a gate layer formed over pillars and trenches, in accordance to one embodiment of the present invention.
Figure 4B:
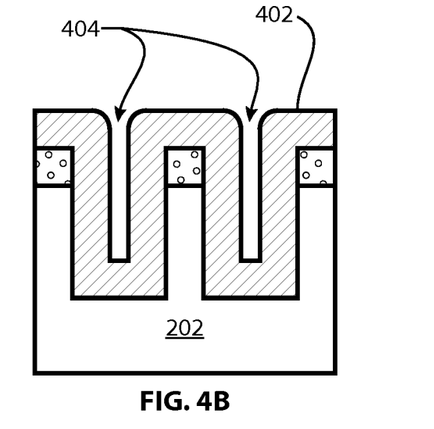
FIG. 4B is a cross-sectional diagram of an intermediary step depicting a gate layer and gate trenches formed over pillars and trenches, in accordance to one embodiment of the present invention.

FIG. 4A schematically depicts semiconductor device array 100 from cross-section A 102, after forming a gate layer 402 over the pillars 306 and trenches 302/304. In some embodiments, the gate layer 402 is composed of a polycrystalline silicon material. FIG. 4B depicts the same step in fabrication as FIG. 4A, from cross-section B 104. FIG. 4B also depicts a plurality of gate trenches 404 resulting from the gate layer 402 formation within the horizontal trenches 304.

Figure 4C:
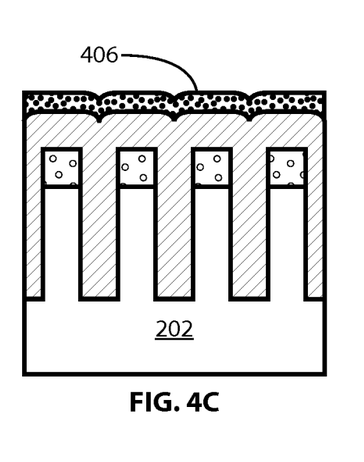
FIG. 4C is a cross-sectional diagram of an intermediary step depicting a filler layer formed over a gate layer, in accordance to one embodiment of the present invention.
Figure 4D:
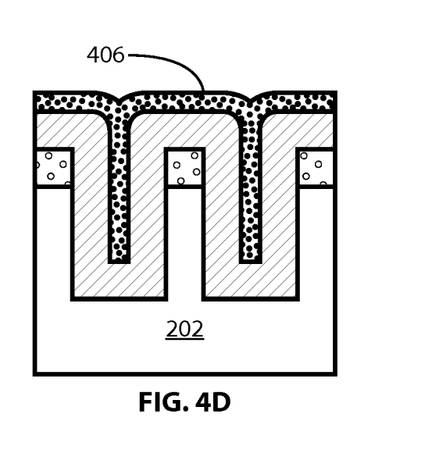
FIG. 4D is a cross-sectional diagram of an intermediary step depicting a filler layer formed within gate trenches and over a gate layer, in accordance to one embodiment of the present invention.

FIG. 4C schematically depicts semiconductor device array 100 from cross-section A 102, after forming a filler layer 406 over the gate layer 402. In some embodiments, the filler layer is composed of a low temperature silicon-oxide (SiO) or carbon material. FIG. 4D depicts the same step in fabrication as FIG. 4C, from cross-section B 104. The diagram also depicts the filler layer 406 filling in the gate trenches 404.

Figure 4E:
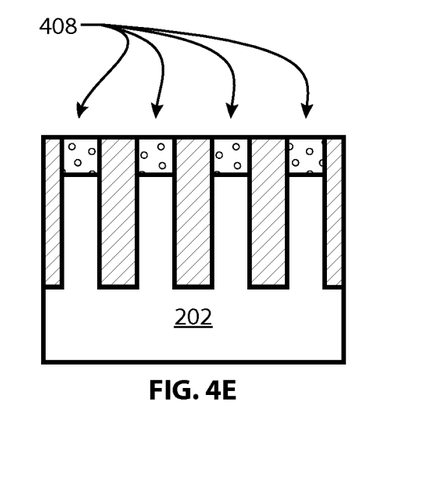
FIG. 4E is a cross-sectional diagram of an intermediary step depicting a planarized gate layer and filler layer, in accordance to one embodiment of the present invention.
Figure 4F:
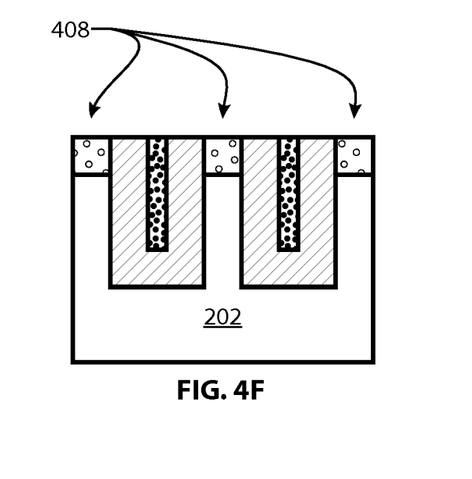
FIG. 4F is a cross-sectional diagram of an intermediary step depicting a planarized gate layer and filler layer, in accordance to one embodiment of the present invention.

FIG. 4E schematically depicts semiconductor device array 100 from cross-section A 102, after planarization of the filler layer 406 and gate layer 404. The diagram depicts a plurality of exposed top surfaces 408 of the pillars 306. FIG. 4F depicts the same step in fabrication as FIG. 4E, from cross-section B 104.

Figure 5A:
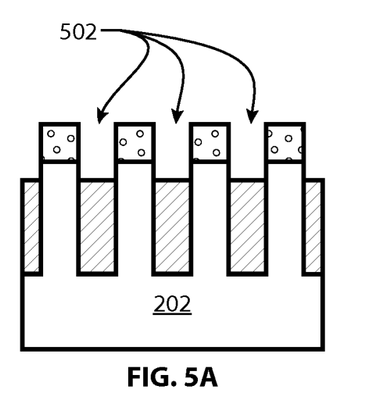
FIG. 5A is a cross-sectional diagram of an intermediary step depicting a first portion etched into a gate layer, in accordance to one embodiment of the present invention.
Figure 5B:
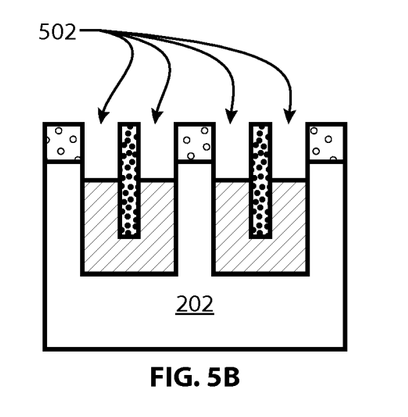
FIG. 5B is a cross-sectional diagram of an intermediary step depicting a first portion etched into a gate layer, in accordance to one embodiment of the present invention.

FIG. 5A schematically depicts semiconductor device array 100 from cross-section A 102, after etching a first portion 502 of the gate layer 402. FIG. 5B depicts the same step in fabrication as FIG. 5A, from cross-section B 104.

Figure 5C:
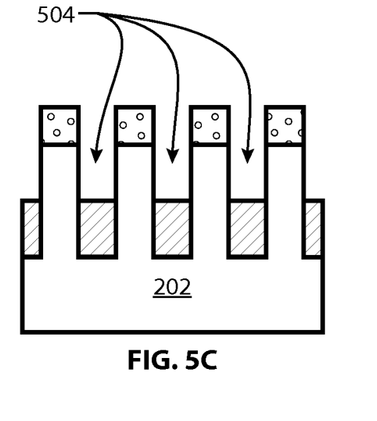
FIG. 5C is a cross-sectional diagram of a semiconductor device array after gate formation, in accordance to one embodiment of the present invention.
Figure 5D:
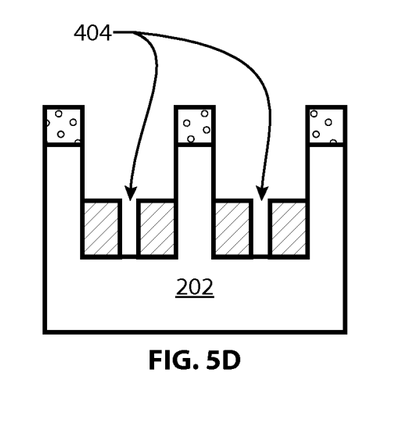
FIG. 5D is a cross-sectional diagram of a semiconductor device array after gate formation, in accordance to one embodiment of the present invention.

FIG. 5C schematically depicts semiconductor device array 100 from cross-section A 102, after removal of the filler layer 406, and etching a second portion 504 of the gate layer 403. FIG. 5D depicts the same step in fabrication as FIG. 5C, from cross-section B 104. The diagram also depicts the gate trenches 404 etched to extend through the gate layer 402.

The diagrams from FIG. 6A through 7D are cross-sectional views of intermediary steps during fabrication of a semiconductor device array 600 structure, in accordance to one embodiment of the present invention.

Figure 6A:
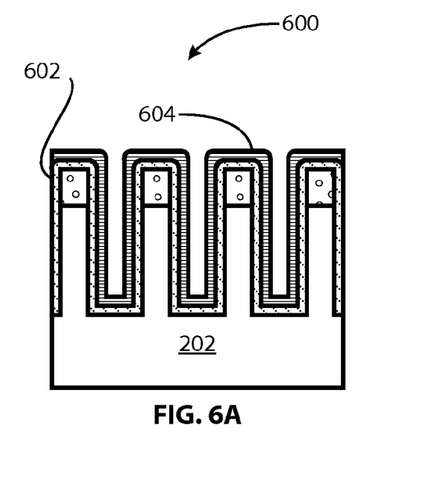
FIG. 6A is a cross-sectional diagram of an intermediary step depicting a dielectric layer and metal gate layer formed over pillars and trenches, in accordance to one embodiment of the present invention.
Figure 6B:
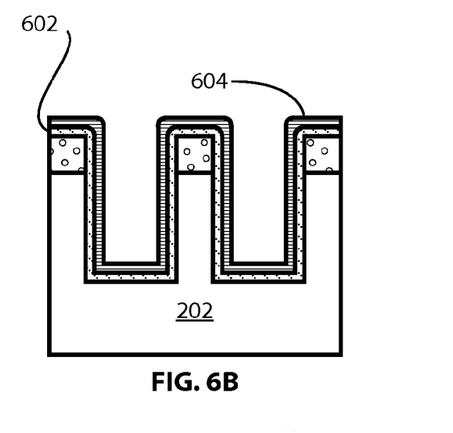
FIG. 6B is a cross-sectional diagram of an intermediary step depicting a dielectric layer and metal gate layer formed over pillars and trenches, in accordance to one embodiment of the present invention.

FIG. 6A schematically depicts semiconductor device array 600 from cross-section A 102, after successively forming a dielectric layer 602 and metal gate layer 604 over the substrate 202. In some embodiments, the dielectric layer 602 is composed of a material with a high dielectric constant, such as hafnium-oxide (HfO). FIG. 6B depicts the same step in fabrication as FIG. 6A, from cross-section B 104.

Figure 6C:
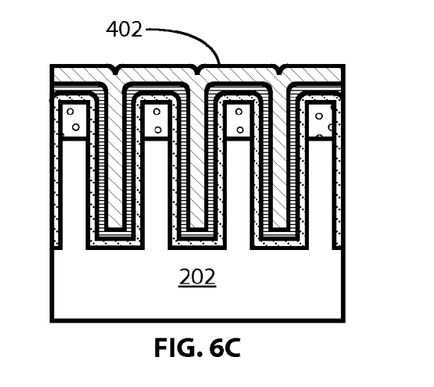
FIG. 6C is a cross-sectional diagram of an intermediary step depicting a gate layer formed over a metal gate layer, in accordance to one embodiment of the present invention.
Figure 6D:
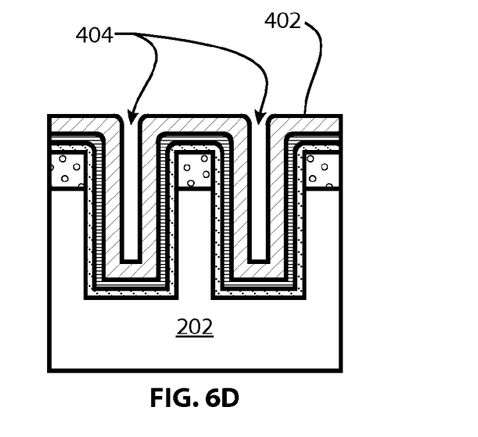
FIG. 6D is a cross-sectional diagram of an intermediary step depicting a gate layer and gate trenches formed over a metal gate layer, in accordance to one embodiment of the present invention.

FIG. 6C schematically depicts semiconductor device array 600 from cross-section A 102, after forming a gate layer 402 over the metal gate layer 604. In this embodiment, the gate layer 402 fills in the vertical trenches 302. In some embodiments, the gate layer 402 is composed of a polycrystalline silicon material. FIG. 6D depicts the same step in fabrication as FIG. 6C, from cross-section B 104. The diagram also depicts gate trenches 404 resulting from the gate layer 402 formation within the horizontal trenches 304.

Figure 6E:
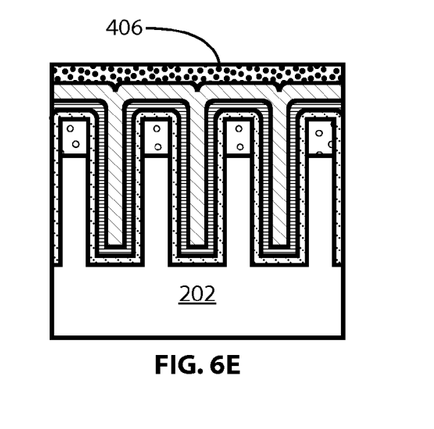
FIG. 6E is a cross-sectional diagram of an intermediary step depicting a filler layer formed over a gate layer, in accordance to one embodiment of the present invention.
Figure 6F:
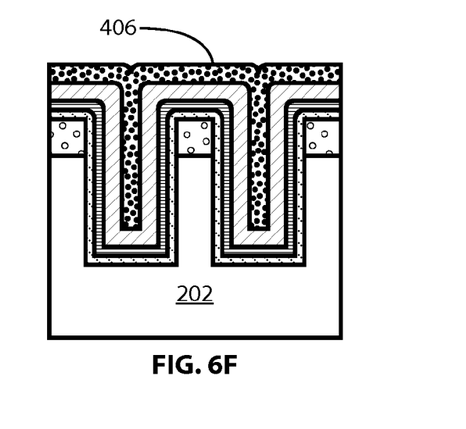
FIG. 6F is a cross-sectional diagram of an intermediary step depicting a filler layer formed within gate trenches and over a gate layer, in accordance to one embodiment of the present invention.

FIG. 6E schematically depicts semiconductor device array 600 from cross-section A 102, after forming a filler layer 406 over the gate layer 402. In some embodiments, the filler layer is composed of a low temperature silicon-oxide (SiO) or carbon material. FIG. 6F depicts the same step in fabrication as FIG. 6E, from cross-section B 104. The diagram also depicts the filler layer 406 filling in the gate trenches 404.

Figure 7A:
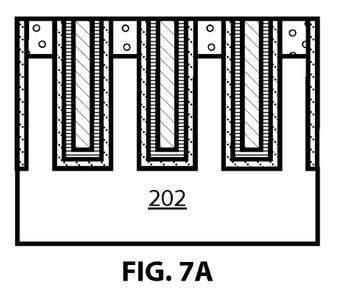
FIG. 7A is a cross-sectional diagram of an intermediary step depicting a planarized gate layer and filler layer, in accordance to one embodiment of the present invention.
Figure 7B:
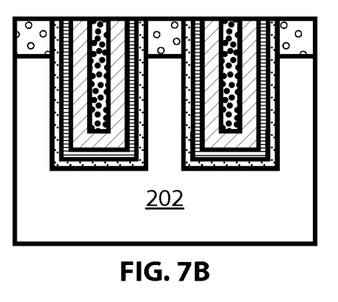
FIG. 7B is a cross-sectional diagram of an intermediary step depicting a planarized gate layer and filler layer, in accordance to one embodiment of the present invention.

FIG. 7A schematically depicts semiconductor device array 600 from cross-section A 102, after planarization of the filler layer 406, gate layer 404, metal gate layer 604, and dielectric layer 602. FIG. 7B depicts the same step in fabrication as FIG. 7A, from cross-section B 104.

Figure 7C:
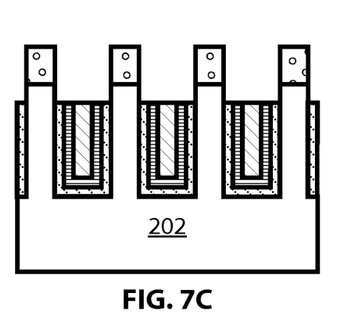
FIG. 7C is a cross-sectional diagram of an intermediary step depicting a first portion etched into a gate layer, metal gate layer and dielectric layer, in accordance to one embodiment of the present invention.
Figure 7D:
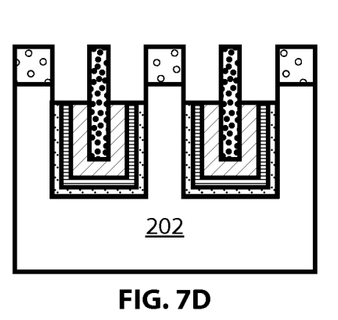
FIG. 7D is a cross-sectional diagram of an intermediary step depicting a first portion etched into a gate layer, metal gate layer and dielectric layer, in accordance to one embodiment of the present invention.

FIG. 7C schematically depicts semiconductor device array 600 from cross-section A 102, after etching a first portion 502 of the gate layer 402, metal gate layer 604, and dielectric layer 602. FIG. 7D depicts the same step in fabrication as FIG. 7C, from cross-section B 104.

Figure 7E:
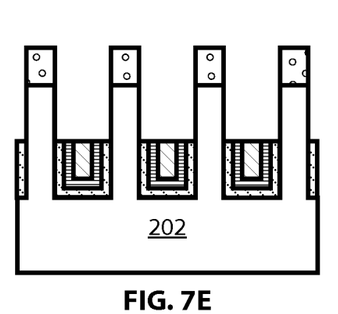
FIG. 7E is a cross-sectional diagram of a semiconductor device array after gate formation, in accordance to one embodiment of the present invention.
Figure 7F:
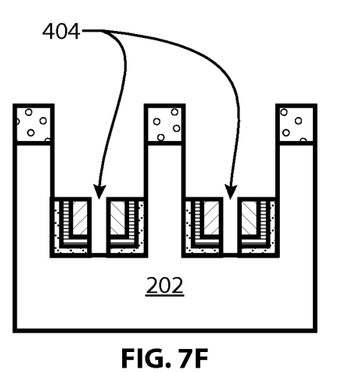
FIG. 7F is a cross-sectional diagram of a semiconductor device array after gate formation, in accordance to one embodiment of the present invention.

FIG. 7E schematically depicts semiconductor device array 600 from cross-section A 102, after removal of the filler layer 406, and etching a second portion 504 of the gate layer 403, metal gate layer 604, and dielectric layer 602. FIG. 7F depicts the same step in fabrication as FIG. 7E, from cross-section B 104. The diagram also depicts the gate trenches 404 etched to extend through the gate layer 402, metal gate layer 604, and dielectric layer 602.

Figure 8:
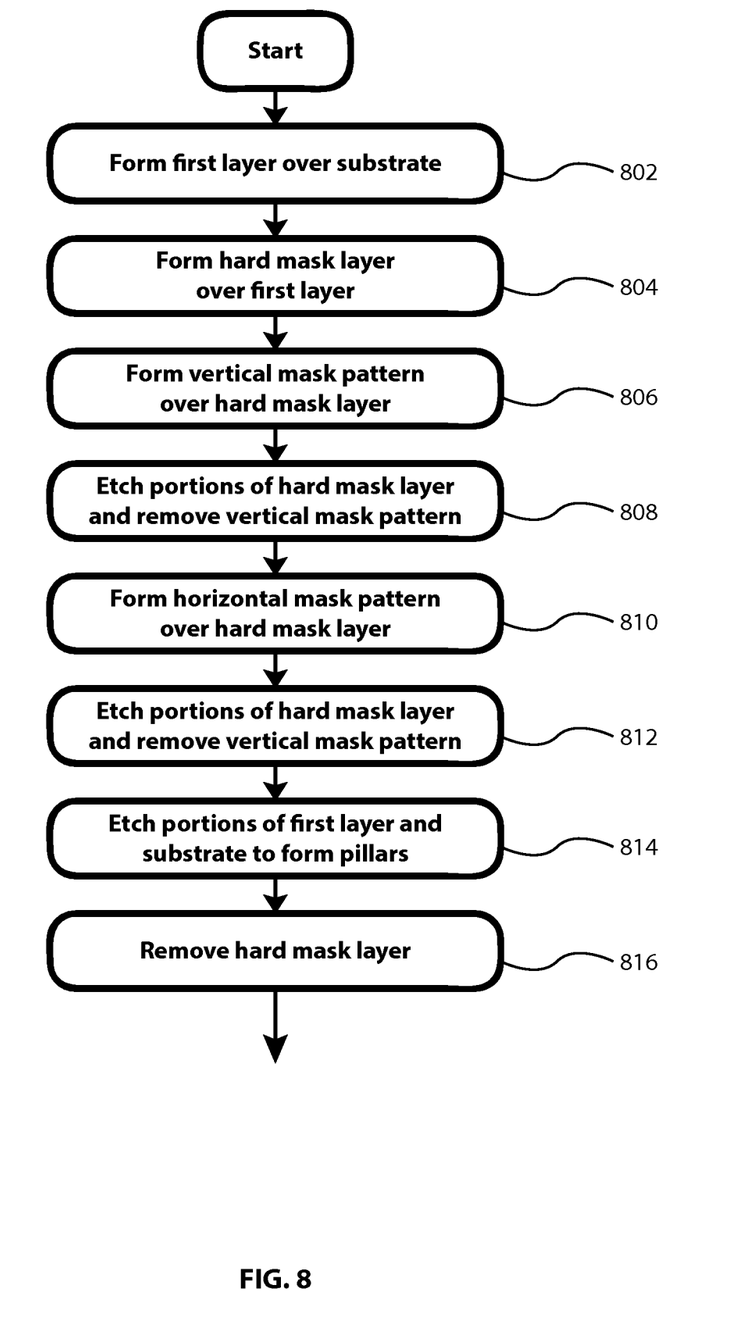
FIG. 8 is a flowchart illustrating an example method for fabricating the plurality of pillars, in accordance to one embodiment of the present invention.

FIG. 8 is a flowchart illustrating an example method for fabricating the plurality of pillars 306 in accordance to one embodiment of the present invention. FIG. 8 will be described with references to FIG. 1 through FIG. 3F. The method begins with forming step 802. At forming step 602, a first layer 204 is deposited over the substrate 202. After forming step 802, the method continues to forming step 804. At forming step 804, a hard mask layer 206 is formed over the first layer 204. After forming step 804, the method continues to forming step 806.

At forming step 806, a vertical mask pattern 208 is formed over the hard mask layer 206 (FIG. 2A and FIG. 2B). After forming step 806, the method continues to etching step 808. At etching step 808, exposed portions of the hard mask layer 206 are etched and the vertical mask pattern 208 is removed (FIG. 2C and FIG. 2D). In some embodiments, a reactive ion etch can (RIE) is utilized to etch the hard mask layer 206. After etching step 808, the method continues to forming step 810.

At forming step 810, a horizontal mask pattern 210 is formed over the hard mask layer 206 and the mask spacer 212 (FIG. 2E and FIG. 2F). One skilled in the art would recognize that the mask spacer 212 can be formed with a variety of deposition and etching processes. After forming step 810, the method continues to etching step 812. At etching step 812, exposed portions of the hard mask layer 206 are etched and the horizontal mask pattern 210 is removed (FIG. 3A and FIG. 3B). In some embodiments, a RIE process is utilized to etch the hard mask layer 206. After etching step 812, the method continues to etching step 814.

At etching step 814, exposed portions of the first layer 204 and substrate 202 are etched to form the plurality of pillars 306 (FIG. 3C and FIG. 3D). In some embodiments, a RIE process is utilized to etch the first layer 204 and substrate 202. After etching step 814, the method continues to removing step 816. At removing step 816, the hard mask layer 206 is removed from the structure (FIG. 3E and FIG. 3F). After removing step 816, the method for fabricating the plurality of pillars 306 is complete. In some embodiments, a thermal oxidation process is utilized to form a thin oxide layer after removal of the hard mask layer 206. In some embodiments, the method proceeds to forming step 902 or forming step 1002.

Figure 9:
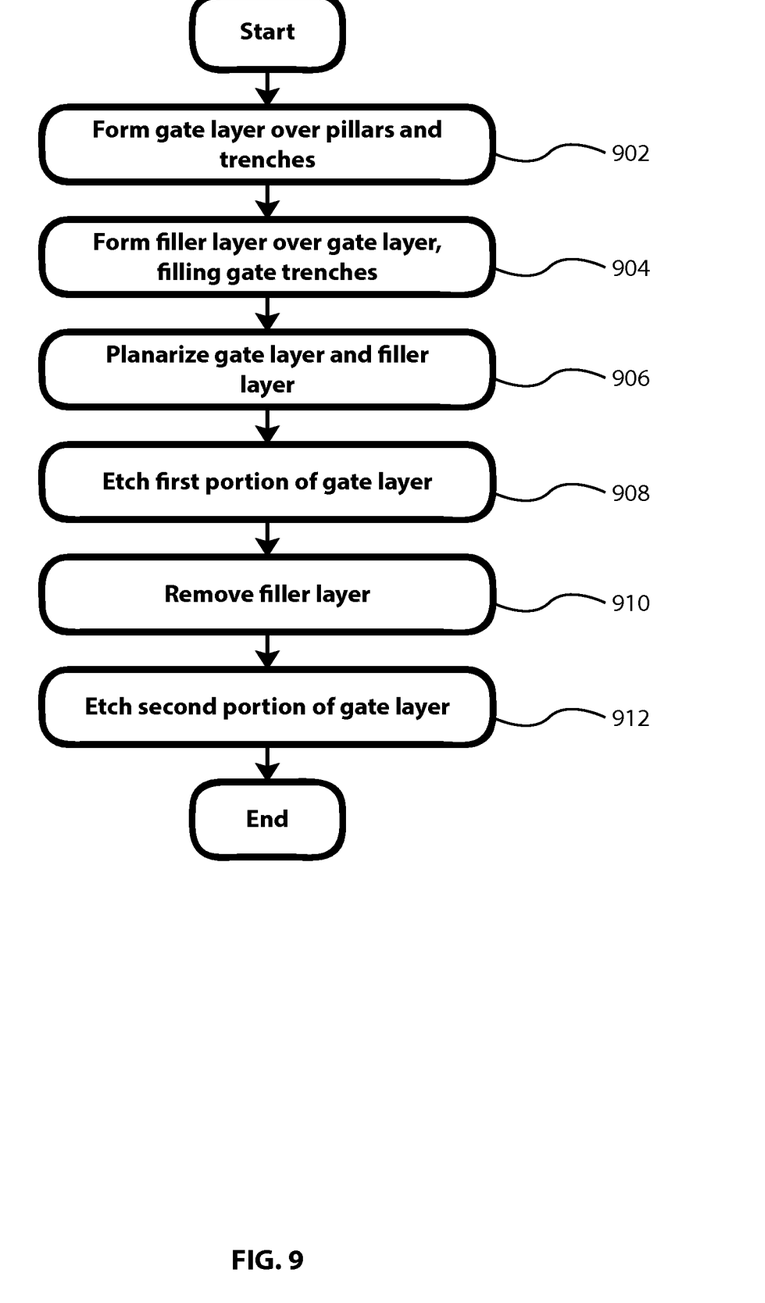
FIG. 9 is a flowchart illustrating an example method for fabricating a vertical surround gate structures, in accordance to one embodiment of the present invention.

FIG. 9 is a flowchart illustrating an example method for fabricating the vertical surround gate structures, in accordance to one embodiment of the present invention. FIG. 9 will be described with references to FIG. 4A through FIG. 5D. The method begins with forming step 902. At forming step 902, the gate layer 402 is formed over the pillars 306 and trenches 302/304 (FIG. 4A and FIG. 4B). After forming step 902, the method proceeds to forming step 904.

At forming step 904, the filler layer 406 is formed over the gate layer 402 (FIG. 4C and FIG. 4D). After forming step 904, the method continues to planarizing step 906. At planarizing step 906, the gate layer 402 and filler layer 406 are planarized (FIG. 4E and FIG. 4F). One skilled in the art would recognize that planarization can be achieved with a variety of processes, including a chemical mechanical polishing (CMP) process. After planarizing step 906, the method continues to etching step 908.

At etching step 908, the first portion 502 of the gate layer 402 is etched (FIG. 5A and FIG. 5B). After etching step 908, the method continues to removing step 910. At removing step 910, the filler layer 406 is removed. One skilled in the art would recognize that the filler layer may be removed with various different processes, including any number of selective etch processes. After removing step 910, the method continues to etching step 912. At etching step 912, the second portion 504 of the gate layer 402 is etched (FIG. 1, FIG. 5C, and FIG. 5D). In some embodiments, the second portion 504 is etched utilizing a RIE process. After etching step 912, the method is complete.

Figure 10:
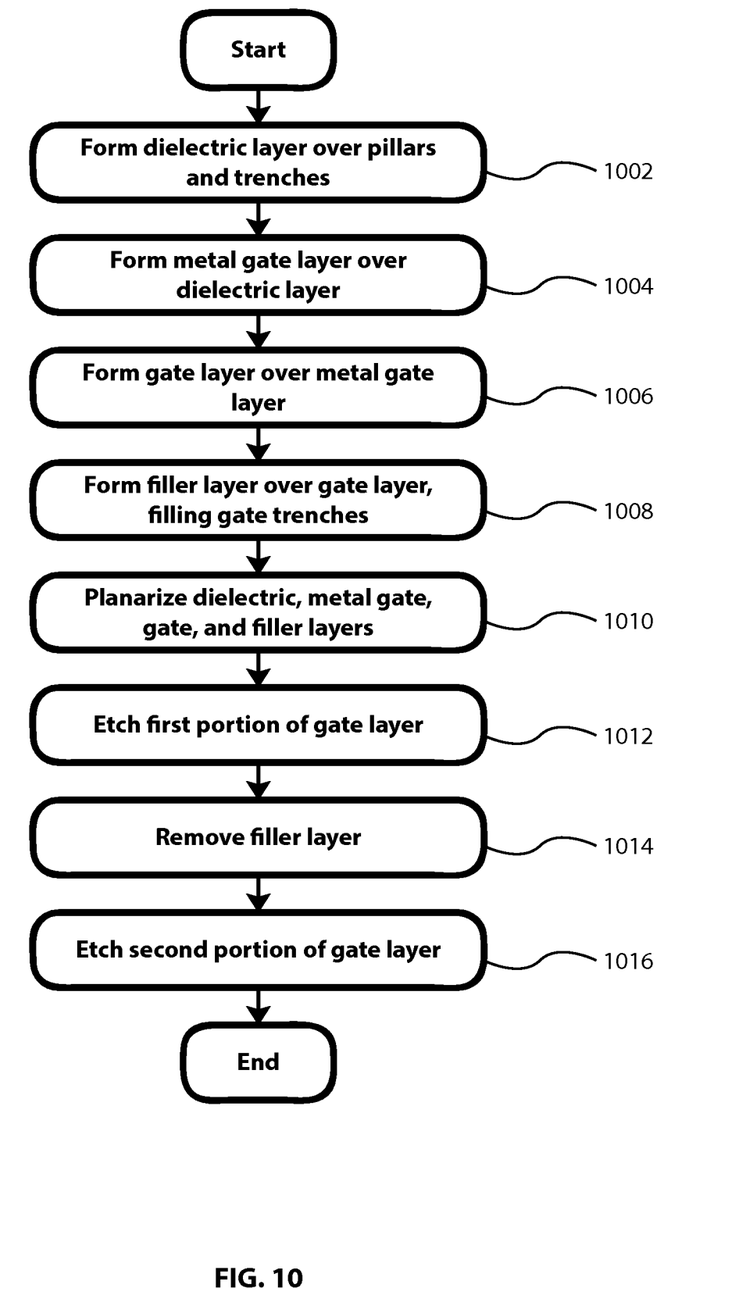
FIG. 10 is a flowchart illustrating an example method for fabricating a vertical surround metal gate structures with, in accordance to one embodiment of the present invention.

FIG. 10 is a flowchart illustrating an example method for fabricating the vertical surround gate structures, in accordance to one embodiment of the present invention. FIG. 10 will be described with references to FIG. 6A through FIG. 7D. The method begins with forming step 1002. At forming step 1002, the dielectric layer 602 is formed over the pillars 306 and trenches 302/304. After forming step 1002, the method continues to forming step 1004. At forming step 1004, the metal gate layer 604 is formed over the dielectric layer 602 (FIG. 6A and FIG. 6B). After forming step 1004, the method continues to forming step 1006.

At forming step 1006 the gate layer 402 is formed over the dielectric layer 602 (FIG. 6C and FIG. 6D). After forming step 1006, the method continues to forming step 1008. At forming step 1008, the filler layer 404 is formed over the gate layer 402 (FIG. 6E and FIG. 6F). After forming step 1008, the method continues to planarizing step 1010. At planarizing step 1010, the filler layer 406, gate layer 402, metal gate layer 604, and dielectric layer 602 are planarized (FIG. 7A and FIG. 7B). After planarizing step 1010, the method continues to etching step 1012.

At etching step 1012, the first portion of the gate layer 402, metal gate layer 604, and dielectric layer 602 are etched (FIG. 7C and FIG. 7D). After etching step 1012, the method continues to removing step 1014. At removing step 1014, the filler layer 406 is removed. One skilled in the art would recognize that the filler layer may be removed with various different processes, including a selective etch. After removing step 1014, the method continues to etching step 1016. At etching step 1016, the second portion 504 of the gate layer 402, metal gate layer 604, and dielectric layer 602 are etched (FIG. 7E and FIG. 7F). In some embodiments, the second portion 504 is etched utilizing a RIE process. After etching step 1016, the method is complete.

Having described preferred embodiments for a method of fabricating a semiconductor device array with vertical surround gate structures, it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a semiconductor device, comprising:
    forming a plurality of pillars on a substrate such that the pillars are separated by a plurality of vertical trenches and horizontal trenches;
    forming a gate layer over the pillars, the vertical trenches and the horizontal trenches such that the gate layer forms a plurality of gate trenches in the horizontal trenches;
    forming fillers within the gate trenches;
    planarizing the gate layer and fillers such that top surfaces of the pillars are exposed;
    etching a first portion of the gate layer;
    removing the fillers; and
    etching a second portion of the gate layer such that the gate trenches extend down through the gate layer.

2. The method of claim 1, wherein the pillars are comprised of a first layer and portions of the substrate.

3. The method of claim 2, wherein the first layer is composed of a silicon nitride (SiN) material.

4. The method of claim 2, wherein forming the pillars comprises:
    forming the first layer over the substrate;
    forming a hard mask layer over the first layer;
    forming a vertical mask pattern over the hard mask, the vertical mask pattern including vertical mask trenches, exposing portions of the hard mask layer;
    etching the exposed portions of the hard mask layer;
    removing the vertical mask pattern;
    forming a horizontal mask pattern over the hard mask layer, the horizontal mask pattern including horizontal mask trenches, exposing portions of the hard mask layer and first layer;
    etching the exposed portions of the hard mask layer, resulting in a hard mask pillar pattern, exposing portions of the first layer;
    removing the horizontal mask pattern;
    etching exposed portions of the first layer and portions of the underlying substrate, resulting in the plurality of pillars; and
    removing the hard mask layer.

5. The method of claim 4, further comprising:
    forming a spacer mask within the etched portions of the hard mask layer; and
    removing the spacer mask.

6. The method of claim 4, wherein etching the hard mask layer, first layer and substrate comprises a reactive ion etch (RIE) process.

7. The method of claim 1, further comprising forming a thin oxide layer on the pillars, wherein forming the thin oxide layer includes a thermal oxidation process.

8. The method of claim 1, wherein the gate layer is composed of a polycrystalline silicon.

9. The method of claim 1, wherein forming fillers within the gate trenches further comprises:
    forming a filler layer over the gate layer; and
    etching the filler layer such that top surfaces of the gate layer are exposed and the gate trenches are filled with the resulting fillers.

10. The method of claim 9, wherein the filler layer is composed of a low temperature silicon-oxide (SiO) or carbon material.

11. The method of claim 1, wherein etching a first portion of the gate layer comprises an isotropic etch process.

12. The method of claim 1, wherein etching a second portion of the gate layer comprises an anisotropic etch process, such as a reactive ion etch (RIE).

13. The method of claim 1, wherein etching a second portion of the gate layer results in a flat gate profile.

14. The method of claim 1, wherein the vertical trenches define a plurality of bit lines and the horizontal trenches define a plurality of word lines.

* * * * *